United States Patent
Gallmeyer et al.

(10) Patent No.: US 6,376,966 B1
(45) Date of Patent: Apr. 23, 2002

(54) METHOD AND APPARATUS FOR CONTROLLING A PIEZOELECTRIC DEVICE

(75) Inventors: Christopher F. Gallmeyer; Larry G. Waterfield, both of Peoria, IL (US)

(73) Assignee: Caterpillar, Inc., Peoria, IL (US)

( * ) Notice: Subject to any disclaimer, the term of this patent is extended or adjusted under 35 U.S.C. 154(b) by 0 days.

(21) Appl. No.: 09/575,762

(22) Filed: May 22, 2000

(51) Int. Cl.$^7$ ................................................ H01L 41/09
(52) U.S. Cl. ...................................................... 310/317
(58) Field of Search .......................... 310/316.01, 317

(56) References Cited

U.S. PATENT DOCUMENTS

| | | | | |
|---|---|---|---|---|
| 4,888,514 A | * | 12/1989 | Takahashi et al. | 310/316.01 |
| 5,068,567 A | | 11/1991 | Jones | 310/332 |
| 5,268,533 A | | 12/1993 | Kovacs et al. | 174/52.4 |
| 5,471,721 A | | 12/1995 | Haertling | 29/25.35 |
| 5,589,725 A | | 12/1996 | Haertling | 310/358 |
| 5,632,841 A | | 5/1997 | Hellbaum et al. | 156/245 |
| 5,714,831 A | * | 2/1998 | Walker et al. | 310/316.01 |
| 5,780,958 A | | 7/1998 | Strugach et al. | 310/348 |
| 5,781,646 A | | 7/1998 | Face | 381/190 |
| 5,811,911 A | | 9/1998 | Janker et al. | 310/332 |
| 5,831,371 A | | 11/1998 | Bishop | 310/328 |
| 5,849,125 A | | 12/1998 | Clark | 156/222 |
| 5,907,212 A | * | 5/1999 | Okada | 310/328 |
| 5,973,441 A | | 10/1999 | Lo et al. | 310/330 |

FOREIGN PATENT DOCUMENTS

JP  61-173682 A  *  8/1986  ............ 310/316.01

* cited by examiner

Primary Examiner—Thomas M. Dougherty
(74) Attorney, Agent, or Firm—Wood, Herron & Evans, LLP

(57) ABSTRACT

A system for controlling the operation of a piezoelectric device including a control system operable to generate a first control signal representing a desired charge on the piezoelectric device and corresponding to a desired position of a piezoelectric device. The control system further includes a charge control circuit responsive to the first control signal for providing a charge control signal to a device control circuit. The device control circuit provides a command signal that causes the piezoelectric device to move to the desired position.

28 Claims, 1 Drawing Sheet

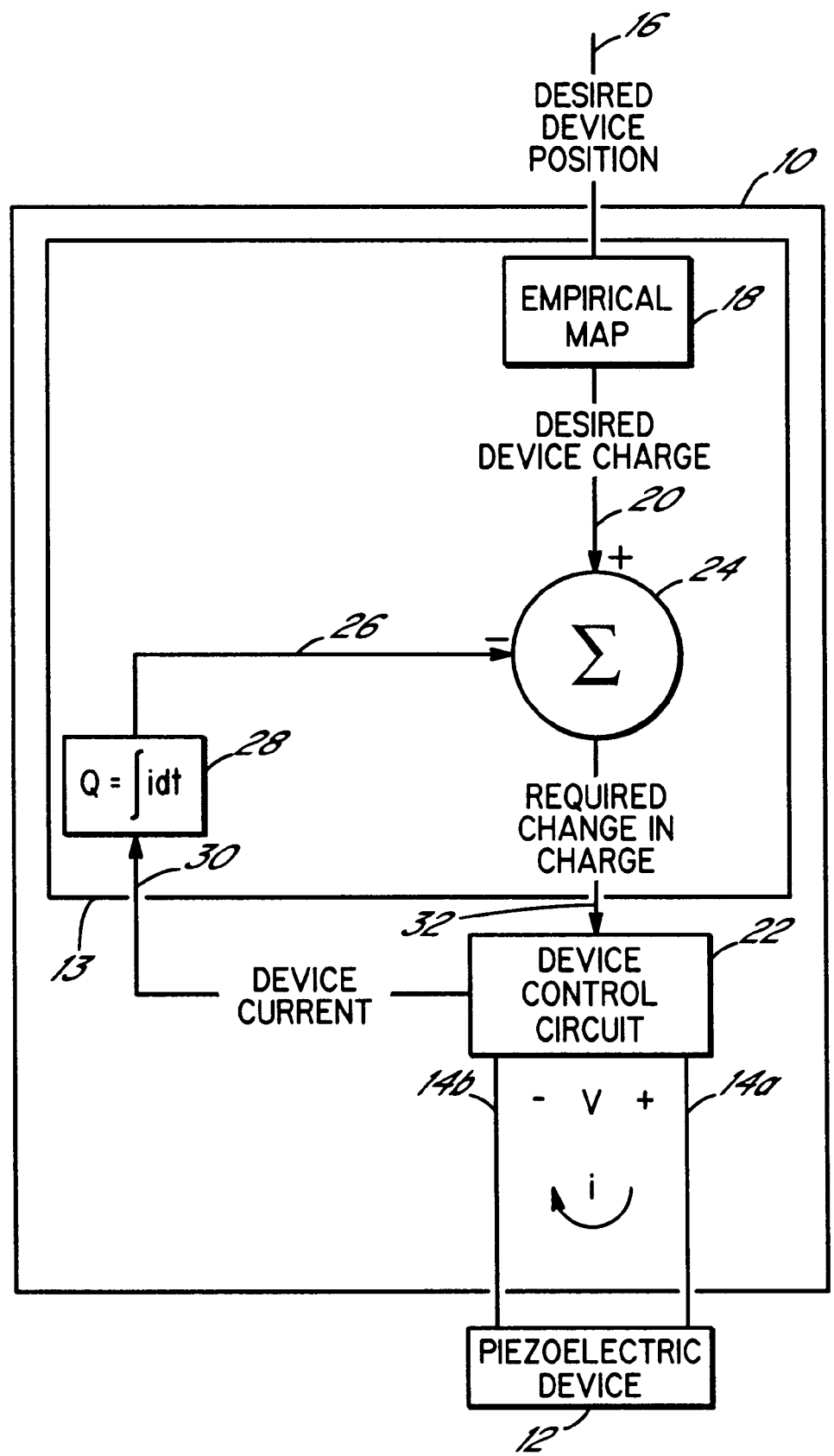

METHOD AND APPARATUS FOR CONTROLLING A PIEZOELECTRIC DEVICE

TECHNICAL FIELD

The present invention relates generally to piezoelectric devices and, more particularly, to an apparatus and method for accurately controlling movement of a piezoelectric device.

BACKGROUND ART

Piezoelectric devices alter their shape in response to an applied electric field. An electric field applied in the direction of polarization effects an expansion of the piezoelectric material in the same direction, while a voltage applied in the opposite direction of polarization will cause a contraction of the material in that same direction. In some applications, piezoelectric bending devices, such as thermally pre-stressed bending devices, use the "bending" action of the device to convert electrical energy into mechanical energy. In such applications, the piezoelectric bending devices may be used as an actuator. In other applications, an outside force may impart a bending action to the device; and the device then converts that mechanical energy resulting from the outside force into electrical energy. In such applications, the piezoelectric bending devices may be used as a sensor.

In many applications, a voltage command signal is normally applied to the piezoelectric device to cause the device to move to a desired position. While such a control system functions well, there are nonlinearities in the operation of the piezoelectric device that are reflected back to the control system. For example, nonlinearities may cause the actuator to not fully move to a desired position in response to a voltage control signal. Further the control signal may cause the actuator to move or change its position in an abrupt or sluggish manner that does not match the desired actuator movement profile for a particular application.

Thus, the present invention is directed to overcoming one or more of the problems set forth above.

DISCLOSURE OF THE INVENTION

While the invention is described in connection with certain embodiments, it will be understood that the invention is not limited to these embodiments. On the contrary, the invention includes all alternatives, modifications and equivalents as may be included within the spirit and scope of the present invention.

In accordance with the principles of the present invention, a control system is operatively connected to the piezoelectric device and responsive to a control signal representing a desired position of the piezoelectric device. The control system provides a command signal as a function of charge on the piezoelectric device that causes the piezoelectric device to move to the desired position. Thus, the present invention drives the piezoelectric device as a function of charge on the piezoelectric device. By utilizing charge as the controlling parameter, the control system of the present invention is free of some of the nonlinearities of a conventional control system that controls the piezoelectric device with a voltage command signal.

In accordance with one aspect of the present invention, the control system includes a charge control circuit responsive to the control signal for providing an output signal representing a desired change in charge on the piezoelectric device. The control system further includes a device control circuit responsive to the output signal of the charge control circuit for providing a command signal corresponding to the desired change in charge on the device.

In accordance with another aspect of the present invention, the charge control circuit includes an integrator circuit responsive to a detected current in the piezoelectric device and provides a charge feedback signal as a function of integrating the detected current over time. The charge control circuit further includes a comparator responsive to the first command signal and the charge feedback signal for providing a charge control signal to the piezoelectric device control circuit.

In another embodiment, the present invention provides a method of causing a piezoelectric device to move to a desired position by first determining a desired charge on the piezoelectric device. Next, a charge feedback is determined; and a control signal is applied to the piezoelectric device as a function of the desired feedback charges. The control signal causes the piezoelectric device to move to the desired position.

In accordance with one aspect of this embodiment of the invention, the charge feedback signal is determined by integrating a detected current flow through the piezoelectric device.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

The FIGURE is a block diagram of a control system for controlling a piezoelectric device in accordance with the principles of the present invention.

BEST MODE FOR CARRYING OUT THE INVENTION

With reference to the FIGURE, a control system 10 is shown in accordance with the principles of the present invention, for controlling a piezoelectric device 12, such as a thermally pre-stressed bending device, that is coupled to the control system 10 through a pair of leads 14*a*, 14*b*. As will be described in detail below, the control system 10 receives a control signal on line 16 from a control signal source (not shown) that corresponds to a desired position of the device 12. In response to the control signal on line 16, the control system 10 utilizes a charge control circuit 13 that causes a drive signal to be applied on lead 14*a* to the device 12 in accordance with a desired and measured charge on the piezoelectric device. In this way, the control system 10 accurately controls displacement of the device 12 in response to receipt of the control signal on line 16 from the control signal source (not shown).

While the above describes the piezoelectric device 12 being used as an actuator, those of ordinary skill in the art will appreciate that the control system 10 is readily adaptable for use in a wide range of piezoelectric device applications without departing from the spirit and scope of the present invention.

The charge control circuit 13 includes a one-dimensional empirical map or data structure 18 that receives the desired device position control signal on line 16 from the control signal source (not shown) as an input to the map 18. The data structure 18 generates, on output line 20, a desired charge signal having a value representing a desired charge on the piezoelectric device 12 that is electrically compatible with a device control circuit 22. The data structure 18 converts the desired device position control signal on input line 16 into the desired charge value. The data structure 18 may be a look-up table stored in RAM or ROM, a software algorithm or a hardwired circuit, as will be readily appreciated by those skilled in the art.

The device control circuit 22 is different from readily known device control circuits in that it provides a command signal that controls or varies a current flowing from the output 14a through the device 12. Further, the device control circuit 22 then measures a voltage produced by the current flowing through the piezoelectric device 12 in response to the command signal. The measured voltage provides a feedback that is used to moderate the rate of charge transfer, that is, the rate of current transfer from the device control circuit 22 to the piezoelectric device 12. A more conventional device control circuit provides a command signal that varies a voltage applied across a piezoelectric device and measures a current flow through the device in response to the commanded voltage. The measured current is then used to moderate the applied voltage. Modifying a conventional device control circuit to provide a command signal varying current and measuring a voltage as a feedback, is readily within the capabilities of those who are skilled the art.

The charge control circuit 13 further includes a comparator or summing junction 24 having, in addition to a first input common with signal line 20, a second input 26 connected to an integrator circuit 28. The integrator circuit 28 has an input 30 on which is received a detected or measured device current signal from the device control circuitry 22. The device current signal represents a magnitude of the current being supplied to the device 12 via the current command signal on the output 14a. The integrator circuit 28 integrates the device current signal over time to provide a charge feedback signal representing the charge of the device 12.

The summing junction 24 compares the desired charge of the device 12 as represented by the charge signal on line 20 with the detected charge of the device 12 represented by the charge feedback signal on line 26. The summing junction 24 provides a charge control signal to an input 32 of the device control circuit. The charge control signal is an error signal representing the difference between the desired and the currently determined charge values. Thus, the charge control signal represents a desired change in charge of the device 12 necessary to cause the currently determined charge on the piezoelectric device to correspond to, or be equal to, the desired charge which is required to move the device 12 to the desired position. The charge control signal is used by the device control circuit 22 to provide the appropriate current command signal on the output 14a to the device 12 so that the device moves to the desired position as represented by the desired device position signal on line 16.

Industrial Applicability

The present invention provides an improved control for a piezoelectric device that is less sensitive to nonlinearities in the operation of the piezoelectric device. In use, it will be appreciated that the control system 10 is operable to provide an improved control system for the piezoelectric device 12 to drive the device 12 to a desired position or displacement. The present invention provides a control system for a piezoelectric device which detects and monitors charge on the piezoelectric device. By utilizing charge as the controlling parameter, the control system of the present invention eliminates some of the nonlinearities of a conventional control system that controls the piezoelectric device with a voltage command signal. The control system 10 of the present invention is effective to provide accurate motion control of the device 12.

While the present invention has been illustrated by a description of various embodiments, and while these embodiments have been described in considerable detail, it is not the intention of Applicants to restrict or in any way limit the scope of the appended claims to such detail. Additional advantages and modifications will readily appear to those skilled in the art. The invention in its broader aspects is, therefore, not limited to the specific details, representative apparatus and method, and illustrative example shown and described. Accordingly, departures may be made from such details without departing from the spirit or scope of Applicants' general inventive concept.

What is claimed is:

1. An apparatus for controlling the operation of a piezoelectric device, comprising a control system operable to receive a control signal representing a desired position of the piezoelectric device, the control system operable to determine a charge on the piezoelectric device and to provide a command signal to the piezoelectric device as a function of the charge on the piezoelectric device and the control signal, the command signal operable to cause the piezoelectric device to move to the desired position.

2. The apparatus of claim 1 wherein the control system comprises:

a charge control circuit operable to receive the control signal and a device current signal representing a current applied to the piezoelectric device, the charge control circuit operable to provide an output signal representing a desired change in charge on the piezoelectric device as a function of the control signal and the device current signal; and a device control circuit coupled with the charge control circuit to receive the output signal, the device control circuit operable to provide the command signal as a function of the output signal, the device control circuit further operable to provide the device current signal to the charge control circuit as a function of the command signal.

3. The apparatus of claim 2 wherein the charge control circuit comprises:

a data structure operable to receive the control signal and to generate a desired charge signal in response to the control signal;

an integrator circuit coupled with the device control circuit to receive the device current signal and operable to provide a detected charge signal as a function of an integral of the device current signal; and a comparator coupled with the data structure to receive the desired charge signal and coupled with the integrator circuit to receive the detected charge signal, the comparator operable to provide the output signal as a function of the desired charge signal and the detected charge signal.

4. The apparatus of claim 3 wherein the output signal comprises a function of the difference between the desired charge signal and the detected charge signal.

5. The apparatus of claim 1 wherein the piezoelectric device comprises a piezoelectric bender actuator.

6. A method of causing a piezoelectric device to move to a desired position, comprising:
- determining a desired charge on the piezoelectric device;
- determining a detected charge on the piezoelectric device;
- applying a control signal to the piezoelectric device as a function of the desired and detected charges, the control signal operable to cause the piezoelectric device to move to the desired position.

7. The method of claim 6, further comprising:
- determining a desired position of the piezoelectric device; and
  - wherein determining a desired charge on the piezoelectric device comprises determining a desired charge as a function of the desired position of the piezoelectric device.

8. The method of claim 6 wherein determining a detected charge on the piezoelectric device comprises:
- determining a current applied to the piezoelectric device; and
- determining the detected charge as a function of the current applied to the piezoelectric device.

9. The method of claim 8 wherein determining the detected charge comprises integrating the current applied to the piezoelectric device.

10. The method of claim 6 wherein the control signal comprises the difference between the desired and detected charges on the piezoelectric device.

11. A method of operating a piezoelectric device comprising:
- receiving a control signal indication of the piezoelectric device;
- determining a charge on the piezoelectric device; and
- generating a command signal as a function of charge on the piezoelectric device and the control signal, the command signal operable to cause the piezoelectric device to move to a desired position.

12. The method of claim 11, further comprising:
- generating a charge signal representing a change in charge on the piezoelectric device; and
- generating the command signal as a function of the charge signal.

13. The method of claim 12, further comprising generating a desired charge signal representing a desired charge on the piezoelectric device that corresponds to the desired position of the piezoelectric device.

14. The method of claim 13, further comprising generating a charge feedback signal representing a charge on the piezoelectric device.

15. The method of claim 14, further comprising:
- generating a detected current signal representing current flow through the piezoelectric device; and
- generating a charge feedback signal in response to the detected current signal.

16. The method of claim 15, further comprising:
- comparing the desired charge signal with the charge feedback signal to generate the control signal, the control signal representing a desired change in charge of the piezoelectric device.

17. An apparatus for controlling a piezoelectric device, comprising:
- a charge control circuit operable to receive a control signal indicative of a desired position of the piezoelectric device and a device current signal indicative of a current applied to the piezoelectric device, the charge control circuit operable to transmit a charge control signal as a function of the control signal and the device current signal; and
- a device control circuit coupled with the charge control circuit to receive the charge control signal and to transmit a command signal to the piezoelectric device as a function thereof, the command signal being operable to control the displacement of the piezoelectric device, the device control circuit further operable to determine the device current signal as a function of the command signal and to transmit the device current signal to the charge control circuit.

18. The apparatus of claim 17 wherein the charge control circuit comprises:
- a map circuit operable to receive the control signal, the map circuit operable to transmit a desired charge signal indicative of a desired charge on the piezoelectric device as a function of the control signal;
- a comparator circuit operable to receive a charge feedback signal indicative of a charge on the piezoelectric device, and coupled with the map circuit to receive the desired charge signal, the comparator circuit operable to transmit a charge control signal as a function of the charge feedback signal and the desired charge signal; and
- an integrator circuit coupled with the device control circuit to receive the device current signal, the integrator circuit operable to transmit the charge feedback signal to the comparator as a function of the device current signal.

19. The apparatus of claim 18 wherein the charge control signal is a function of the difference between the charge feedback signal and the desired charge signal.

20. The apparatus of claim 17 wherein the charge control signal is indicative of a desired change in charge on the piezoelectric device.

21. A method of operating a piezoelectric device, comprising:
- determining a desired charge on the piezoelectric device;
- determining an actual charge on the piezoelectric device; and
- controlling the displacement of the piezoelectric device as a function of the desired charge and the actual charge on the piezoelectric device.

22. The method of operating a piezoelectric device of claim 21 wherein the piezoelectric device comprises a bender actuator.

23. A method of operating a piezoelectric device, comprising:
- determining a desired charge on the piezoelectric device;
- determining an actual charge on the piezoelectric device; and
- controlling the position of the piezoelectric device as a function of the desired charge and the actual charge on the piezoelectric device.

24. The method of claim 23 wherein the piezoelectric device comprises a bender actuator.

25. The method of claim 23 wherein determining a desired charge on the piezoelectric device comprises:
- determining a desired position of the piezoelectric device; and determining a desired charge on the piezoelectric device as a function of the desired position of the piezoelectric device.

26. The method of claim 23 wherein determining an actual charge on the piezoelectric device comprises:

determining a current applied to the piezoelectric device; and determining a charge on the piezoelectric device as a function of the current applied to the piezoelectric device.

27. The method of claim 26 wherein determining a charge on the piezoelectric device as a function of the current applied to the piezoelectric device comprises integrating the current applied to the piezoelectric device to determine the charge.

28. The method of claim 23 wherein controlling the position of the piezoelectric device as a function of the desired charge and the actual charge on the piezoelectric device comprises transmitting a command signal as a function of the desired charge and actual charge on the piezoelectric device, the command signal operable to cause the piezoelectric device to move to a predetermined position.

* * * * *

UNITED STATES PATENT AND TRADEMARK OFFICE
CERTIFICATE OF CORRECTION

PATENT NO.   : 6,376,966 B1
DATED        : April 23, 2002
INVENTOR(S)  : Christopher F. Gallmeyer, et al.

It is certified that error appears in the above-identified patent and that said Letters Patent is hereby corrected as shown below:

<u>Column 5,</u>
Line 31, remove the word "indication" and replace with the words -- indicative of a desired position --.

Signed and Sealed this

Tenth Day of September, 2002

Attest:

Attesting Officer

JAMES E. ROGAN
*Director of the United States Patent and Trademark Office*